US005448240A

United States Patent [19]
Morito

[11] Patent Number: 5,448,240
[45] Date of Patent: Sep. 5, 1995

[54] REMOTE CONTROL INPUT DEVICE

[75] Inventor: Koichi Morito, Furukawa, Japan

[73] Assignees: Alps Electric Co., Ltd.; Sony Corporation, both of Tokyo, Japan

[21] Appl. No.: 933,445

[22] Filed: Aug. 21, 1992

[30] Foreign Application Priority Data

Aug. 29, 1991 [JP] Japan .............................. 3-076246 U
Aug. 29, 1991 [JP] Japan .............................. 3-076247 U
Aug. 29, 1991 [JP] Japan .................................. 3-242454

[51] Int. Cl.6 ............................................. H01H 19/02
[52] U.S. Cl. ................................ 341/176; 341/20; 341/35; 341/173; 340/825.56; 200/11 R; 174/52.1
[58] Field of Search ...................... 341/20, 22, 34, 35, 341/173, 176, 184, 190; 345/156-172, 184; 361/679, 727, 728, 781; 340/825.69, 825.72, 825.56; 200/4, 6 R, 11 R, 11 TW, 19 R, 293; 174/50, 52.1; 220/DIG. 6

[56] References Cited
U.S. PATENT DOCUMENTS

| 4,045,777 | 8/1977 | Mierzwinski et al. | 359/146 |
| 5,095,303 | 3/1992 | Clark et al. | 345/164 |
| 5,191,320 | 3/1993 | MacKay | 345/184 |
| 5,248,961 | 9/1993 | Fujii | 345/164 |
| 5,270,690 | 12/1993 | Oberg | 345/163 |

FOREIGN PATENT DOCUMENTS 0382353 8/1990 European Pat. Off. .
3-34383 4/1991 Japan .
2053539 2/1981 United Kingdom .

OTHER PUBLICATIONS

Steven H. Leibson, "Thumb-actuated, cursor-positioning device provides 2-D axis control in a small space", *Electrical Design News* (1989) Feb. 2, No. 3, pp. 119–120, Newton, Mass., US.
IBM, "Space Bar That Rolls", *IBM Technical Disclosure Bulletin*, Aug. 1989, vol. 32 No. 3B, pp. 122–123.

*Primary Examiner*—John K. Peng
*Assistant Examiner*—Andrew Hill
*Attorney, Agent, or Firm*—Guy W. Shoup; Patrick T. Bever

[57] ABSTRACT

An input device including a case defining an opening, a bearing member pivotally mounted in the case about an axis and disposed adjacent to the opening, a roller rotatably disposed on the bearing member and having a portion exposed through the opening, an encoder disposed adjacent the axis of the bearing member and coupled to the roller by a belt, and a push button switch disposed to contact a portion of the bearing member away from the axis, such that manual rotation of the roller causes the belt to rotate the encoder, thereby producing a first output signal, and pressing the roller causes activation of the push button switch by pivoting the bearing member, thereby producing a second signal. A water receiving member is disposed in the case between the bearing member and roller. The water receiving member has a main chamber into which is disposed the roller, and a subchamber connected to the main chamber by a cut-out passage. A drainage passage is formed in the case and connected to the subchamber for allowing water to exit the main chamber.

9 Claims, 3 Drawing Sheets

REMOTE CONTROL INPUT DEVICE

FIELD OF THE INVENTION

The present invention relates to an input device which is suitable as a remote-controlled device (hereinafter referred to simply as a remote control) for use in TVs and video tape recorders, for example, and which is designed to output a control signal to a display when a manipulatable roller is manually operated to rotate the same.

DESCRIPTION OF THE RELATED ART

As one of that type of input devices, there has been conventionally known a remote control as disclosed in Japanese Utility Model Laid-Open No. 3-34383. The disclosed remote control comprises a manipulatable roller which is partly projecting through a window opening formed in a case, and an encoder mounted to a rotary shaft of the manipulatable roller inside the case. A control signal depending on the amount and the direction of rotation of the manipulatable roller, that are detected by the encoder, is outputted to a display as external equipment. Use of such a remote control enables an operator to move a cursor indicated on a CRT or the like of the display depending on the amount and the direction of rotation of the manipulatable roller, for example, by manually rotating the manipulatable roller. To decide image information displayed at the cursor position thus set, a decision key is depressed to actuate a push button switch in the case so that a necessary control signal may be outputted to the display. Note that the decision key is usually disposed in such a manner as to be exposed near the manipulatable roller.

With the prior art input device as mentioned above, however, because the decision key must be depressed after manually rotating the manipulatable roller, the amount through which a finger has to be moved for the manipulation is necessarily large and thus operability is not satisfactory.

Also, in order that the above type input device has a smaller thickness and improved operability, it is preferable to set a smaller diameter of the manipulatable roller and use an encoder whose size is as small as possible. However, even the small-sized encoder still has a relatively large diameter almost twice as large as a diameter of the small-sized manipulatable roller. For this reason, if the manipulatable roller and the encoder are coaxially arranged like the prior art device, there occurs a large stepwise difference in level between a manipulatable roller accommodating portion (i.e., a peripheral edge portion of the window opening) and an encoder accommodating portion on the manipulating surface of the case, thus adversely affecting its aesthetic appearance and the degree of freedom in design. The aesthetic appearance may be improved by matching the roller's diameter with the encoder's diameter; however, this would require using a roller having an undesirably large diameter.

Furthermore, in the above type input device, a clearance must be left to ensure smooth rotational manipulation of the manipulatable roller between the window opening of the case through which the manipulatable roller is exposed and the manipulatable roller. Accordingly, if water or the like is accidentally spilled over the case, the water may enter the case through the clearance and reach a printed circuit board or the like, with the risk of a short-circuit.

SUMMARY OF THE INVENTION

Accordingly, a first object of the present invention is to solve the above-stated problems experienced in the prior art and provide an input device with a manipulatable roller which requires a smaller amount of movement of a finger necessary for the manipulation.

A second object of the present invention is to provide an input device in which an aesthetic appearance and the degree of freedom in design will not be adversely affected even by using a small-sized manipulatable roller.

A third object of the present invention is to provide an input device with a manipulatable roller which is less likely to cause a trouble of short-circuit even if water enters through the window opening of the case, and thus highly reliable.

The first object of the present invention is achieved by a movable bearing member having a receiving portion to support a rotary shaft of a manipulatable roller in a journalled manner and a pressing portion held in abutment against a push button switch is disposed in a case and held angularly movable with respect to the case, and the center of angular movement of the movable bearing member and the axis of the rotary shaft are offset from each other.

The second object of the present invention is achieved by the rotary shaft of the manipulatable roller and a rotary shaft of an encoder, provided with respective pulleys and these pulleys are coupled to each other using a belt.

The third object of the present invention is achieved by a rib projecting from the case and surrounding the window opening of the case, and a water receiving member disposed in the case, the water receiving member being provided with a main chamber which accommodates the manipulatable roller and is fitted with the rib, a sub-chamber adjacent to the main chamber and coupled to a drainage passage, and a cut-out serving as a passage between the main chamber and the sub-chamber.

With the above construction, when the manipulatable roller is pushed down by a finger, a rotative force is applied to the movable bearing member through the rotary shaft so that the pressing portion of the movable bearing member presses the push button switch in the case for actuating the same. Accordingly, a desired control signal can be output ted to the display by pushing down the manipulatable roller after manually rotating the same, without moving the finger from the manipulatable roller.

Also, since the axis of rotation of the manipulatable roller and the axis of rotation of the encoder can be spaced from each other by any desired distance, the need for forming a large stepwise level difference on the manipulated surface of the case can be eliminated by setting the axis of rotation of the manipulatable roller having a reduced diameter at a position higher than the axis of rotation of the encoder.

Furthermore, since the space in the case facing the window opening is partitioned by the rib of the case and the main chamber of the water receiving member, some amount of water entering through the window opening can be accumulated in the main chamber and naturally dried up there without leaking to any other locations. Should a large amount of water enters the main chamber, the water would be caused to flood through the cut-out to flow into the sub-chamber, followed by discharge through the drainage passage from the sub-chamber.

DETAILED DESCRIPTION OF THE PREFERRED EMBODIMENT

Hereinafter, an embodiment of the present invention will be described with reference to the drawings.

Figure 1:
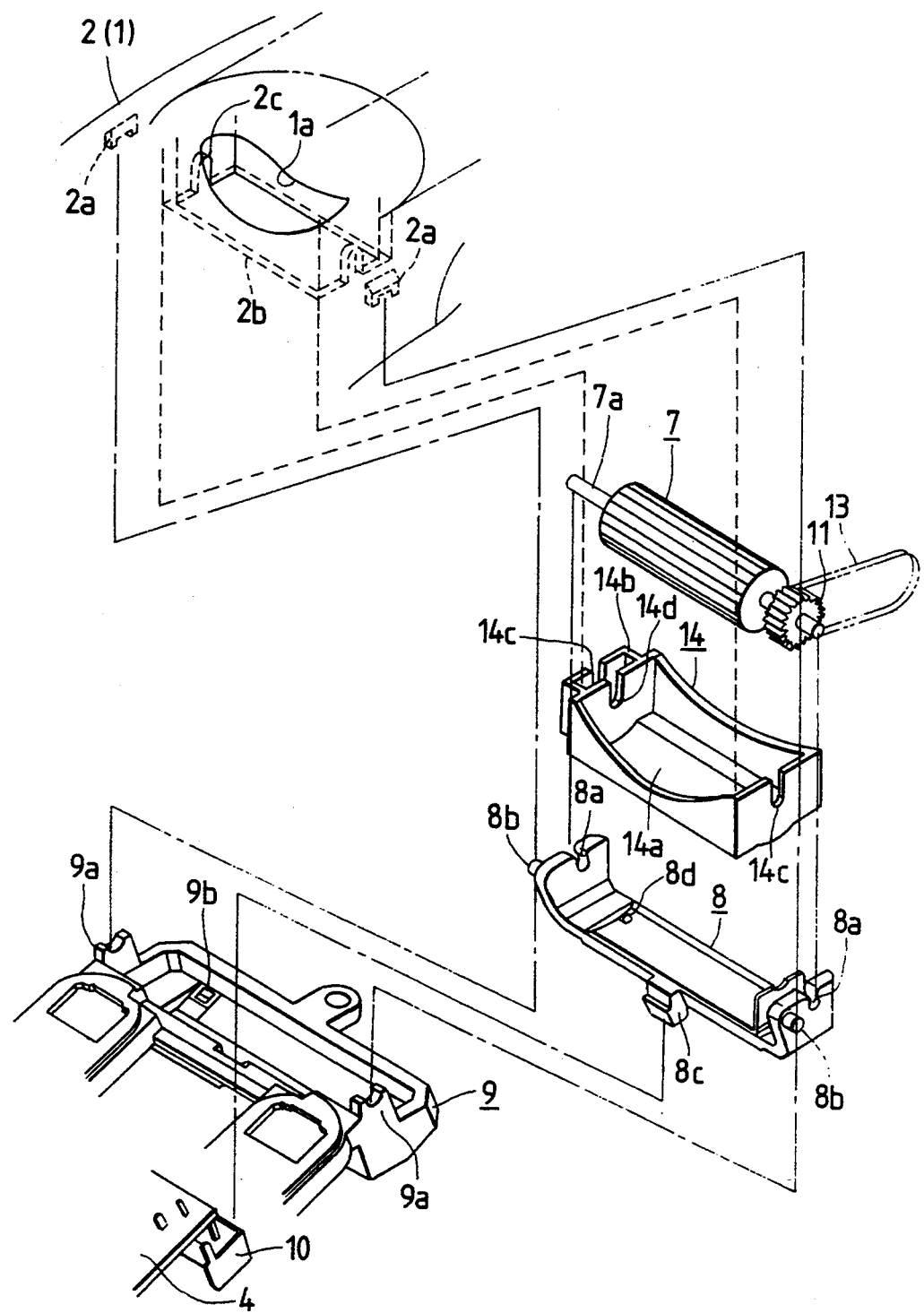
FIG. 1 is an exploded perspective view of principal parts of a remote control according to one embodiment of the present invention.
Figure 2:
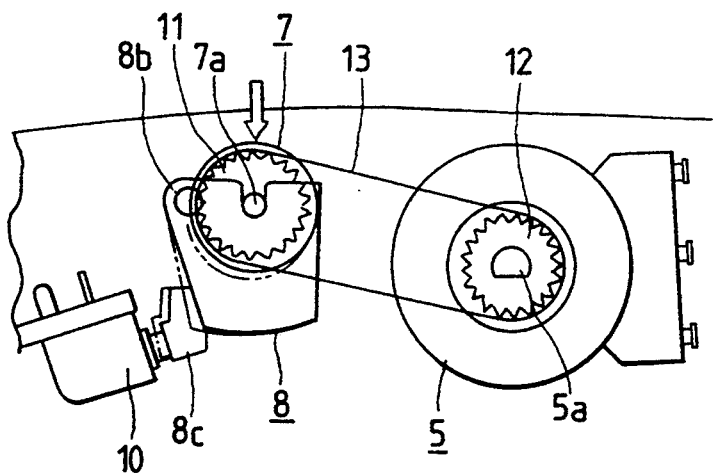
FIG. 2 is a view for explaining operation of the remote control.
Figure 3:
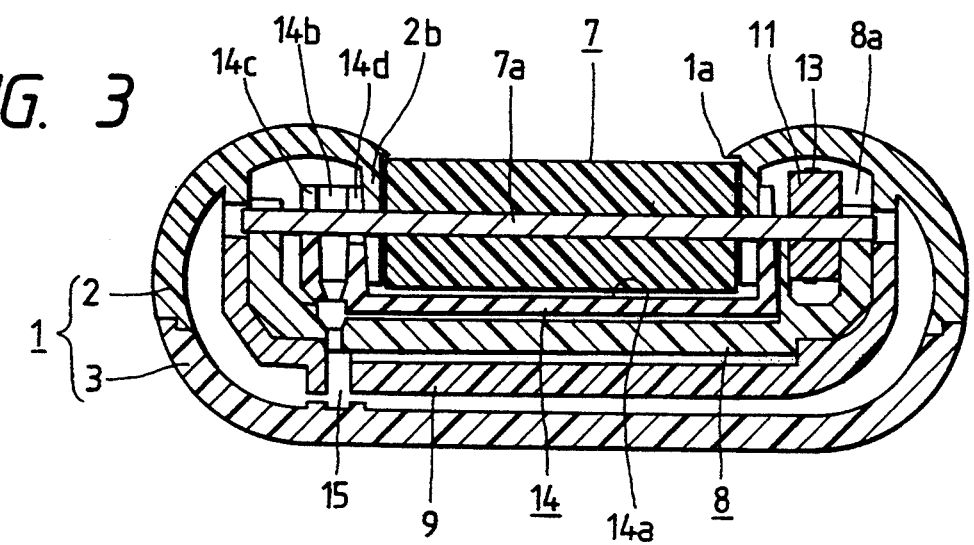
FIG. 3 is a sectional view of the remote control taken along in the lengthwise direction of a manipulatable roller.
Figure 4:
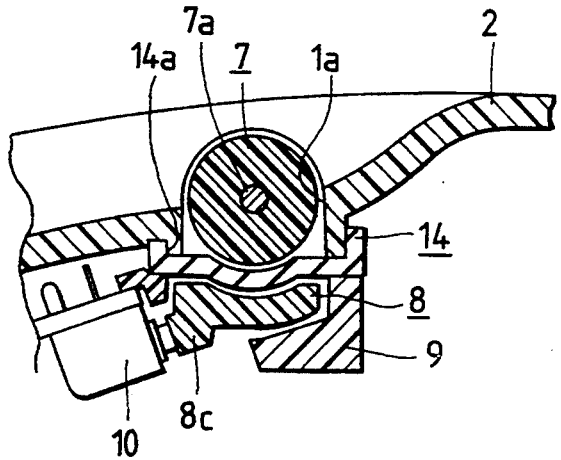
FIG. 4 is a sectional view of the remote control taken along in the radial direction of the manipulatable roller.
Figure 5:
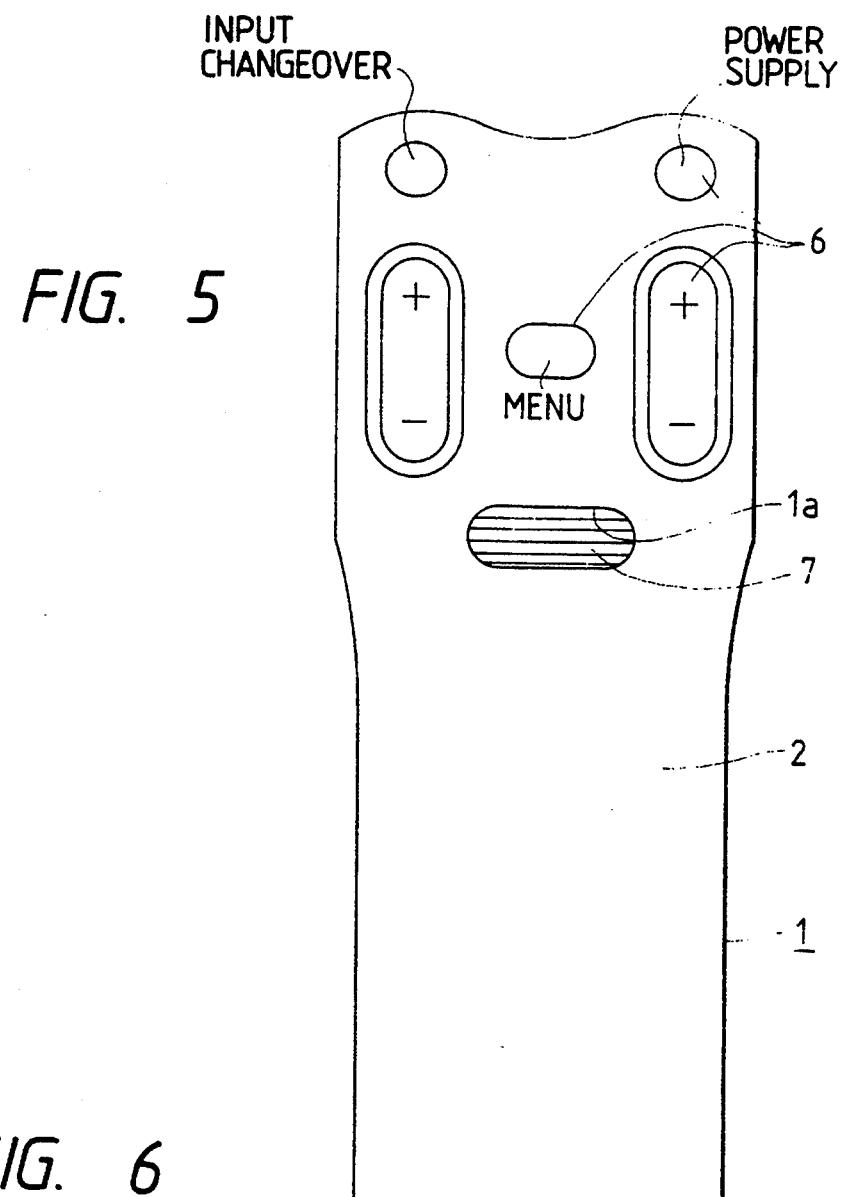
FIG. 5 is an entire plan view of the remote control.
Figure 6:
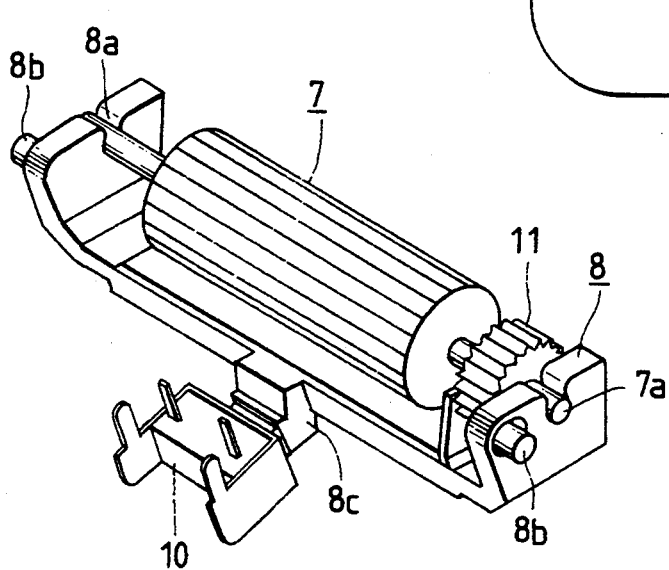
FIG. 6 is a perspective view, partly omitted, showing the positional relationship between a movable bearing member for the manipulatable roller and a push button switch of the remote control.

FIGS. 1 through 6 are all helpful in illustrating a remote control as an example of one embodiment of an input device according to the present invention in which; FIG. 1 is an exploded perspective view of principal parts of the remote control, FIG. 2 is a view for explaining operation of the remote control, FIG. 3 is a sectional view of the remote control taken along in the lengthwise direction of a manipulatable roller, FIG. 4 is a sectional view of the remote control taken along in the radial direction of the manipulatable roller, FIG. 5 is an entire plan view of the remote control, and FIG. 6 is a perspective view, partly omitted, showing the positional relationship between a movable bearing member for the manipulatable roller and a push button switch of the remote control.

The input device shown in these drawings serves as a remote control for use in TVs and video tape recorders, and has a resin-made case 1 comprised of an upper case 2 and a lower case 3 combined with each other. A printed circuit board 4, an encoder 5 and so on are incorporated inside the case 1. On the surface of the upper case 2 as the manipulating surface, there is a plurality of exposed key switches 6 adapted to functions such as to turn on or off a power supply, select a menu and adjust sound volume, as well as a manipulatable roller 7 adapted to control the position of a cursor, by way of example.

The manipulatable roller 7 is integral with a rotary shaft 7a made of metal, the rotary shaft 7a being supported by a pair of receiving portions 8a of a resin-made movable bearing member 8 in a journalled manner which is assembled in the case 1. The manipulatable roller 7 is therefore rotatable about its own axis while partly projecting through a window opening 1a located on the manipulating surface of the case 1. A pair of recessed projections 2a projecting from the rear surface of the upper case 2 and a pair of recessed projections 9a on a resin-made support plate 9 for supporting the printed circuit board 4 inside the case 1 support respective stubs 8b of the movable bearing member 8 in a journal led manner, which are projected with their axes set offset from the axis of the rotatable shaft 7a, so that the movable bearing member 8 is held in the case 1 to be rotatable with respect thereto. When the manipulatable roller 7 is pushed down, a rotative force is applied to the movable bearing member 8 through the rotary shaft 7a, causing both the manipulatable roller 7 and the movable bearing member 8 to rotate together about the stubs 8b. A pressing ledge 8c projecting from a predetermined position of the movable bearing member 8 is kept in abutment against a push button switch 10 disposed on one end side of the printed circuit board 4. Accordingly, when the manipulatable roller 7 is pushed down to rotate the movable bearing member 8, the pressing ledge 8c presses the push button switch 10 so that the switch 10 is actuated. (See FIG. 2 and FIG. 6).

Further, a pulley 11 is attached to one end of the rotary shaft 7a of the manipulatable roller 7 and, likewise, a pulley 12 is attached to one end of a rotary shaft 5a of the encoder 5, both the pulleys 11, 12 being coupled to each other by a timing belt 13. In other words, use of the pulleys 11, 12 and the timing belt 13 provides the mechanism by which both the rotary shafts 7a, 5a can be rotated in interlock relation with no shift in angular phase therebetween, while keeping the axis of rotation of the manipulatable roller 7 and the axis of rotation of the encoder 5 spaced from each other. As a result, the amount and the direction of rotation of the manipulatable roller 7 can be surely detected by the encoder 5.

A tube-shaped rectangular rib 2b projecting on the rear surface of the upper case 2 surrounds the window opening 1a, and a water receiving member 14 made of rubber is disposed between the manipulatable roller 7 and the movable bearing member 8 in the case 1. The water receiving member 14 is divided into a main chamber 14a which accommodates the manipulatable roller 7 and is fitted with the rib 2b, and a small sub-chamber 14b which is positioned adjacent to the main chamber 14a and which includes an opening leading to a drainage passage 15 (see FIG. 3). The main chamber 14a and the sub-chamber 14b are provided in their side walls with respective U-shaped slots 14c which are recessed so as not to interfere with the rotary shaft 7a of the manipulatable roller 7. A partition between the main chamber 14a and the sub-chamber 14b is provided with a cut-out 14d which serves not only as a slot recessed to be out of interference with the rotary shaft 7a, but also as an inter-connecting passage deeper than the U-shaped slot 14c. In addition, the rib 2b on the rear surface of the upper case 2 is similarly provided with a pair of U-shaped slots 2c recessed to be out of interference with the rotary shaft 7a. Note that a through hole 8d bored in the movable bearing member 8 and a through hole 9b bored in the support plate 9, shown in FIG. 1, are connected to the sub-chamber 14b of the water receiving member 14 to form the drainage passage 15.

With the present remote control constructed as has been explained, when the manipulatable roller 7 exposed through the window opening 1a of the ease 1 is manually rotated, the amount and the direction of rotation of the manipulatable roller 7 are detected by the encoder 5 and a signal for controlling the position of a cursor indicated on a CRT of a TV set is outputted to move the cursor in a desired manner. In order to decide image information displayed at the set position of the cursor, the manipulatable roller 7 having been rotated to set the cursor position is now pushed down, as shown in FIG. 2, to press and actuate the push button switch 10 through the pressing ledge 8c of the movable bearing member 8, whereupon a predetermined control signal is outputted to provide the necessary information. Accordingly, after manually rotating the manipulatable roller 7, the operator can output a desired control signal by pushing down the manipulatable roller 7 without moving his or her finger from the roller 7. Therefore, the amount through which the finger must be moved for actuating the switch is reduced and a high degree of operability is expected. It should be noted that since the manipulatable roller 7 is pushed down against the resilient force of a return spring (not shown) assembled in the push button switch 10, discontinuation of the push-down force allows the manipulatable roller 7 and the movable bearing member 8 to be returned to the original position by the resilient force of the return spring. In other words, the manipulatable roller 7 and the movable bearing member 8 are both angularly movable about the stubs 8b and the angle of this angular movement is set so large that the pressing ledge 8c can be displaced by a distance corresponding to the stroke through which the push button switch 10 is actuated.

In this embodiment of the remote control, the pulley 11 attached to the rotary shaft 7a of the manipulatable roller 7 and the pulley 12 attached to the rotary shaft 5a of the encoder 5 are coupled to each other by the timing belt 13, and the axis of rotation of the manipulatable roller 7 having a reduced diameter is set at a position higher than the axis of rotation of the encoder 5 which is also reduced in size, but still has a relatively large diameter. This construction eliminates not only the need for forming a large stepwise level difference in the manipulating surface of the case 1 (i.e., the surface of the upper case 2), but also any fear of impairing an aesthetic appearance and restricting the degree of freedom in design. Then, since the axis-to-axis distance between the manipulatable roller 7 and the encoder 5 coupled to each other by the timing belt 13 is allowed to shift depending on flexibility of the timing belt 13, there is no problem even when the manipulatable roller 7 is angularly moved to some extent about the stubs 8b of the movable bearing member 8. Where the components are arranged such that the above axis-to-axis distance is widened upon the manipulatable roller 7 being pushed down (see FIG. 2) like this embodiment, the return force of the timing belt 13 itself is also utilized when the manipulatable roller 7 and the movable bearing member 8 are both returned to the original position after pushing down the manipulatable roller 7. A variation of the illustrated embodiment, where the components are arranged such that the above axis-to-axis distance is narrowed upon the manipulatable roller 7 being pushed down, there is no problem so long as the return spring used for returning the push button switch 10 has a relatively strong resilient force.

In addition, with the present remote control, the space in the case 1 facing the window opening 1a is partitioned by the rib 2b on the rear surface of the upper case 2 and the main chamber 14a of the water receiving member 14. Therefore, even if some amount of water enters the case 1 through the window opening 1a, for example, upon water being accidentally spilled over the case, the water can be accumulated in the main chamber 14a and naturally dried up there without leaking to any other locations. Should a large amount of water enter the main chamber 14a, the water can exist through the cut-out 14d to flow into the sub-chamber 14b, followed by discharge through the drainage passage 15 from the sub-chamber 14b. As a result, there is no fear that the water entered through the window opening 1a may cause a short-circuit, which ensures high reliability.

It should be noted that functions effected by manually operating the manipulatable roller to rotate and push down the same can be set optionally depending on demands. By way of example, those functions may be set such that images are advanced frame by frame or scrolled by rotating the manipulatable roller 7 and on/off control of rewinding and fast forwarding of tapes may be changed over by pushing down the manipulatable roller 7.

Needless to say, the present invention is also applicable to any desired input devices with manipulatable rollers other than the illustrated remote control.

According to the present invention, as has been described above, since the push button switch in the case can be pressed and actuated through the movable bearing member by pushing down the manipulatable roller manually without moving the finger from the same it is possible to provide the input device with the manipulatable roller which requires a smaller amount of movement of a finger necessary for the manipulation and thus has a high degree of operability.

Also, according to the present invention, since the encoder is interlockingly coupled to the manipulatable roller through the pulleys and the belt, the axis of rotation of the manipulatable roller having a reduced diameter can be set at a position higher than the axis of rotation of the encoder. This eliminates the need of forming a large stepwise level difference in the manipulating surface of the case. As a result, there can be obtained advantages of improving an aesthetic appearance and increasing the degree of freedom in design of the thin-type input device with the manipulatable roller.

Furthermore, according to the present invention, even if water enters through the window opening of the case through which the manipulatable roller is exposed, the water can be accumulated in the main chamber of the water receiving member and naturally dried up there, or the water can be discharged through the drainage passage from the sub-chamber of the water receiving member. It is thus possible to provide the input device with the manipulatable roller which has no fear of causing a trouble of short-circuit with the water entering through the window opening of the case and is highly reliable.

What is claimed is:

1. An input device comprising:
    a case having an upper surface defining an opening;
    a bearing member pivotally mounted in the case about an axis and disposed below the opening, the bearing member including a pressing portion;
    a roller rotatably disposed on the bearing member and having a portion exposed through the opening, the roller being mounted on a shaft and including a first pulley;
    an encoder disposed in the case adjacent the bearing member and having a second pulley connected to the first pulley by a belt such that manual rotation of the roller causes rotation of the encoder, thereby causing the encoder to generate a first output signal; and
    a switch disposed in the case such that the bearing member is located between the switch and the encoder, the switch contacting the pressing portion of the bearing member such that downward movement of the roller causes the bearing member to pivot about the axis, causing the pressing portion to move sideways toward and to activate the switch, thereby causing the switch to generate a second signal.

2. The input device of claim 1 further comprising;
a water receiving member disposed in the case between the bearing member and the roller, and
a rib formed on the case around the opening and extending into the water receiving member such that water which enters through the opening is received in the water receiving member.

3. The input device of claim 2 wherein the water receiving member further comprises:
a main chamber into which is disposed the roller; and
a subchamber connected to the main chamber by a cutout passage.

4. The input device of claim 3 further comprising a drainage passage formed in the case and connected to the subchamber.

5. An input device comprising:
a case including an upper wall defining an elongated opening, the elongated opening having first and second opposing edges;
a bearing member mounted below the elongated opening and pivotally disposed in the case about a first axis, the first axis being located adjacent the first edge;
a roller rotatably disposed on the bearing member around a shaft having a second axis, the second axis being positioned between the first edge and the second edge, the roller having a portion exposed through the elongated opening;
an encoder disposed inside the case adjacent the second edge;
means for transmitting a rotation of the roller to the encoder such that manual rotation of the roller causes an associated rotation of the encoder, thereby causing the encoder to generate a first output signal; and
a switch disposed in the case adjacent the first edge of the elongated opening such that the bearing member is located between the switch and the encoder, the switch contacting a side portion of the bearing member such that downward movement of the roller causes the bearing member to pivot about the first axis and activate the switch, thereby causing the switch to generate a second signal.

6. An input device according to claim 5, further comprising:
a rib integrally formed on the case around the elongated opening and extending into the case; and
a water receiving member is disposed in said case under the elongated opening, the water receiving member including a main chamber which accommodates said roller and receives the rib, a sub-chamber adjacent to said main chamber and coupled to a drainage passage, and a passage formed between said main chamber and said sub-chamber.

7. An input device according to claim 5, wherein the means for transmitting a rotation of the roller to the encoder comprises:
a first pulley connected to the shaft;
a second pulley connected to the encoder; and
a belt connected between the first and second pulleys.

8. An input device comprising:
a case having an upper wall defining an opening;
a bearing member having an upper portion located adjacent an inner surface of the upper wall and a lower portion located below the opening away from the upper wall, the bearing member being pivotally connected to the case by a pair of stubs formed on a first side of the upper portion, the pair of stubs defining a first axis, the bearing member including a pressing lever formed on the lower portion;
a roller rotatably disposed on the bearing member such that a portion of the roller is exposed through the opening, the roller including a shaft and a first pulley, the shaft defining a second axis which is offset from the first axis;
an encoder disposed inside the case on a second side of the bearing member such that the bearing member is located between the first axis and the encoder, the encoder including a second pulley;
a belt connected between the first pulley and the second pulley such that manual rotation of the roller causes an associated rotation of the encoder, thereby causing the encoder to generate a first output signal; and
a switch disposed in the case on the first side of the bearing member such that the bearing member is located between the switch and the encoder, the switch having an actuating member;
wherein downward movement of the roller causes the bearing member to pivot about the first axis such that the pressing lever of the bearing member moves laterally to activate the switch, thereby causing the switch to generate a second signal.

9. An input device according to claim 8, further comprising:
a rib integrally formed on the case around the opening and extending into the case; and
a water receiving member is disposed in said case under the opening, the water receiving member including a main chamber which accommodates said roller and receives the rib, a sub-chamber adjacent to said main chamber and coupled to a drainage passage, and a passage formed between said main chamber and said sub-chamber.

* * * * *